(12) United States Patent
Lim et al.

(10) Patent No.: US 11,894,595 B2
(45) Date of Patent: Feb. 6, 2024

(54) SUBSTRATE INTEGRATED WAVEGUIDE TRANSITION INCLUDING AN IMPEDANCE TRANSFORMER HAVING AN OPEN PORTION WITH LONG SIDES THEREOF PARALLEL TO A CENTERLINE

(71) Applicant: Waymo LLC, Mountain View, CA (US)

(72) Inventors: Edwin Lim, Mountain View, CA (US); Tegan Argo, Mountain View, CA (US); Marvin Weinstein, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 18/059,655

(22) Filed: Nov. 29, 2022

(65) Prior Publication Data

US 2023/0107707 A1 Apr. 6, 2023

Related U.S. Application Data

(63) Continuation of application No. 17/135,268, filed on Dec. 28, 2020, now Pat. No. 11,539,107.

(51) Int. Cl.
*H01P 5/107* (2006.01)
*H01P 3/12* (2006.01)
(Continued)

(52) U.S. Cl.
CPC .............. *H01P 5/107* (2013.01); *H01P 3/082* (2013.01); *H01P 3/121* (2013.01); *H05K 1/024* (2013.01); *H05K 2201/0195* (2013.01)

(58) Field of Classification Search
CPC ........... H01P 3/121; H01P 5/107; H01P 5/024
(Continued)

(56) References Cited

U.S. PATENT DOCUMENTS 6,191,670 B1 2/2001 Nguyen
7,082,235 B2 7/2006 Gunn
(Continued)

FOREIGN PATENT DOCUMENTS

KR 101090857 B1 12/2011

OTHER PUBLICATIONS

International Search Report and Written Opinion for corresponding PCT application No. PCT/US2021/072514 dated Mar. 8, 2022.

*Primary Examiner* — Benny T Lee
(74) *Attorney, Agent, or Firm* — McDonnell Boehnen Hulbert & Berghoff LLP

(57) ABSTRACT

Example embodiments relate to substrate integrated waveguide (SIW) transitions. An example SIW may include a dielectric substrate having a top surface and a bottom surface and a first metallic layer portion coupled to the top surface of the dielectric substrate that includes a single-ended termination, an impedance transformer, and a metallic rectangular patch located within an open portion in the first metallic layer portion such that the open portion forms a non-conductive loop around the metallic rectangular patch. The SIW also includes a second metallic layer portion coupled to the bottom surface of the dielectric substrate and metallic via-holes electrically coupling the first metallic layer to the second metallic layer. The SIW may be implemented in a radar unit to couple antennas to a printed circuit board (PCB). In some examples, the SIW may be implemented with only a non-conductive opening that lacks the metallic rectangular patch.

19 Claims, 5 Drawing Sheets

(51) Int. Cl.
*H01P 3/08* (2006.01)
*H05K 1/02* (2006.01)

(58) Field of Classification Search
USPC .................................................... 333/248, 26
See application file for complete search history.

(56) References Cited

U.S. PATENT DOCUMENTS

| | | |
|---|---|---|
| 7,808,439 B2 | 10/2010 | Yang |
| 11,539,107 B2* | 12/2022 | Lim et al. ............... H01P 3/082 |
| 2004/0150554 A1 | 8/2004 | Stenger |
| 2008/0044126 A1 | 2/2008 | Costa |
| 2008/0266196 A1 | 10/2008 | Shi |
| 2009/0066597 A1 | 3/2009 | Yang |
| 2010/0245155 A1 | 9/2010 | Miyazato |
| 2011/0018657 A1 | 1/2011 | Cheng |
| 2011/0037530 A1 | 2/2011 | Mangalahgari |
| 2011/0050356 A1 | 3/2011 | Nakamura |
| 2012/0176285 A1* | 7/2012 | Morgia ................... H01P 5/107 |
| | | 343/772 |
| 2014/0320364 A1 | 10/2014 | Gu |
| 2015/0270616 A1 | 9/2015 | Jafariou |
| 2016/0056541 A1 | 2/2016 | Tageman |
| 2019/0207286 A1 | 7/2019 | Moallem |

* cited by examiner

SUBSTRATE INTEGRATED WAVEGUIDE TRANSITION INCLUDING AN IMPEDANCE TRANSFORMER HAVING AN OPEN PORTION WITH LONG SIDES THEREOF PARALLEL TO A CENTERLINE

CROSS REFERENCE TO RELATED APPLICATION

The present application is a continuation of U.S. patent application Ser. No. 17/135,268 (now U.S. Pat. No. 11,539,107 issued on Dec. 27, 2022), filed on Dec. 28, 2020, the entire contents is hereby incorporated by reference.

BACKGROUND

A transmission line represents a structure designed to transfer microwave or millimeter power and can be used in various applications. For instance, transmission lines (feed lines) can couple together radio transmitters and receivers with antennas. Transmission lines can also be used to establish computing device network connections and high speed data buses.

Microstrip circuits and waveguides are two types of transmission lines that are often used for applications involving high frequency electromagnetic energy. A microstrip circuit may include a signal carrying microstrip that is separated from a ground plane via a dielectric material. Waveguides are typically hollow conductive conduits with a circular or rectangular cross section that can enable electromagnetic energy to propagate internally between two points with minimal loss. Some systems involve a combination of waveguides and microstrips in different portions of the system. For example, radar systems may operate using signals that propagate between microstrips or similar transmission lines on a printed circuit board (PCB) and waveguides that connect to radiating elements. In such applications, it is often desirable for the transition elements to efficiently couple energy that propagates between different mediums, such as microstrips and waveguides.

SUMMARY

Example embodiments describe substrate integrated waveguide (SIW) transitions that can be used to electrically couple a waveguide to another component, such as a microstrip or another type of transmission line. Such SIW transitions can be used to couple one or more waveguides within an antenna structure to the transmission lines on a printed circuit board (PCB) configured to provide the signals for transmission by the antenna structure and receive signals from the antenna structure for subsequent processing.

In one aspect, an apparatus is provided. The apparatus includes a dielectric substrate having a top surface and a bottom surface and a first metallic layer portion coupled to the top surface of the dielectric substrate. The first metallic layer portion includes a single-ended termination, an impedance transformer, and a metallic rectangular patch located within an open portion in the first metallic layer portion such that the open portion forms a non-conductive loop around the metallic rectangular patch. The apparatus also includes a second metallic layer portion coupled to the bottom surface of the dielectric substrate and a set of metallic via-holes electrically coupling the first metallic layer portion to the second metallic layer portion.

In another aspect, a system is provided. The system includes a waveguide and a substrate integrated waveguide (SIW) transition coupled to the waveguide. The SIW transition includes a dielectric substrate having a top surface and a bottom surface and a first metallic layer portion coupled to the top surface of the dielectric substrate. The first metallic layer portion includes a single-ended termination, an impedance transformer, and a metallic rectangular patch located within an open portion in the first metallic layer portion such that the open portion forms a non-conductive loop around the metallic rectangular patch. The SIW transition also includes a second metallic layer portion coupled to the bottom surface of the dielectric substrate and a set of metallic via-holes electrically coupling the first metallic layer portion to the second metallic layer portion.

In yet another aspect, a method is provided. The method involves conducting electromagnetic energy via a transmission on a printed circuit board (PCB) and coupling the electromagnetic energy into a waveguide via an SIW transition. The SIW transition includes a dielectric substrate having a top surface and a bottom surface and a first metallic layer portion coupled to the top surface of the dielectric substrate. The first metallic layer portion comprises: (i) a single-ended termination, (ii) an impedance transformer, and (iii) a metallic rectangular patch located within an open portion in the first metallic layer portion such that the open portion forms a non-conductive loop around the metallic rectangular patch. The SIW transition also includes a second metallic layer portion coupled to the bottom surface of the dielectric substrate and a set of metallic via-holes electrically coupling the first metallic layer portion to the second metallic layer portion. The method further involves transmitting the electromagnetic energy as signals via one or more antennas coupled to the waveguide.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

Figure 1:
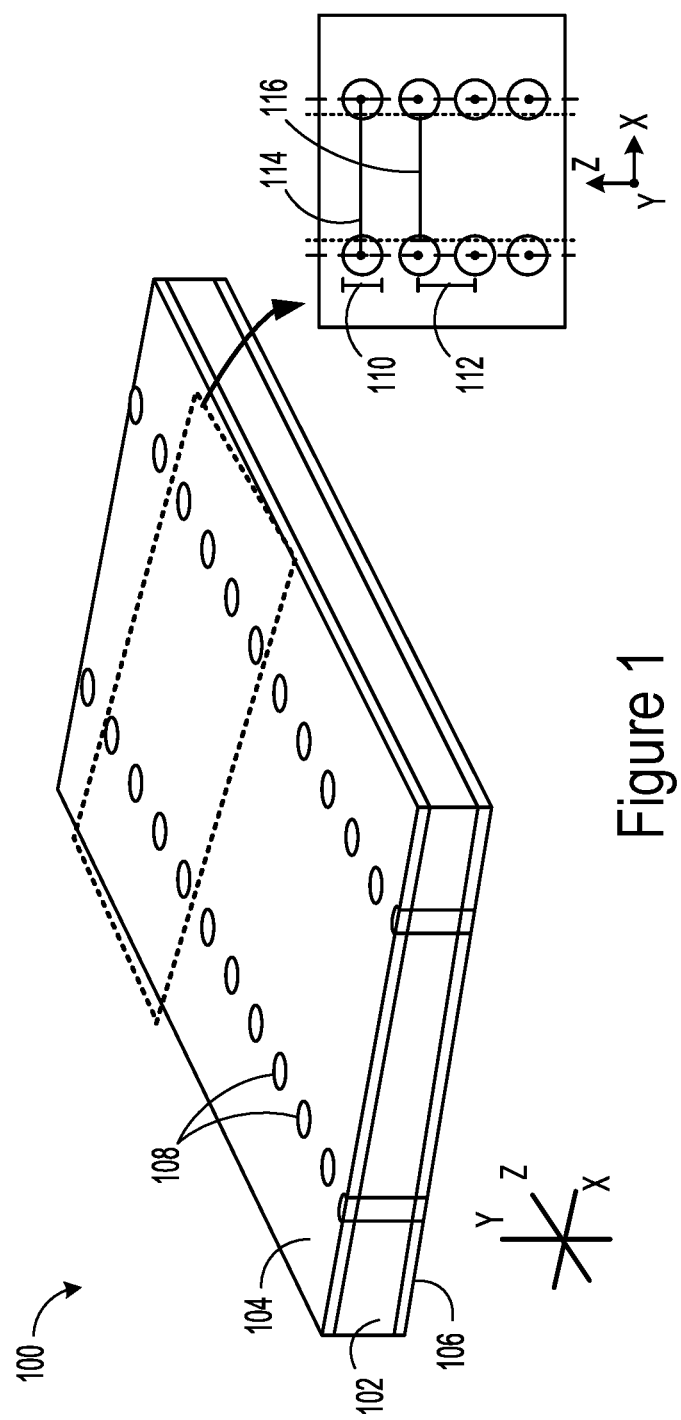
FIG. 1 illustrates a substrate integrated waveguide (SIW), according to one or more example embodiments.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

As technology advances, the need for high-performance millimeter systems continues to increase with many of these applications often relying on low-cost, compact transmission medium compatible with high-frequencies. In particular, for high frequency applications (e.g., above 10 GHz), waveguides are often used to avoid the high insertion and radiation losses that can impact other types of transmission medium (e.g., microstrips, coplanar lines) at these frequencies. The rectangular waveguide topology can help minimize radiation losses and enable low insertion losses when used to propagate electromagnetic energy. Some systems, however, are designed to use a combination of different types of transmission mediums when waveguides are not suitable for some aspects of a system. The SIW was developed for use in such systems.

A SIW is a structure with low-loss interconnect architecture and can be used at millimeter wave frequencies. Unlike other types of transmission medium (e.g., microstrips) that may suffer from transmission drops at higher frequencies, grounded coplanar waveguides can provide low insertion loss at frequencies that exceed 40 Gigahertz (GHz). As such, SIWs can be configured to operate with low insertion loss within applications at higher frequencies, such as 5G, radar (including vehicle radar systems), and other systems that utilize the millimeter wave band.

In general, a SIW is a type of synthetic rectangular electromagnetic waveguide formed in a dielectric substrate by a set of densely arrayed metallized posts, also referred to herein as metallic via-holes or plated through-holes that each serve as connections between the upper and lower metal plates of the substrate. Parallel rows of these metallic via-holes can be arranged to form via fences that delimit the wave propagation area of the SIW. SIWs can be fabricated via low-cost mass-production processes that use through-hole techniques that enable a SIW to operate with similar guided wave and mode characteristics relative to conventional rectangular waveguides with equivalent guide wavelength.

SIWs can be used within systems as interconnections and/or filters. Some issues can arise when a SIW is used as an interconnection between different types of transmission medium (e.g., waveguides and other types of transmission lines). Thus, there is a desire for SIWs to be designed in a way that provides an efficient transition between different topologies of transmission lines as arranged within a system by exciting the correct transmission mode in the SIW cavity with the minimum loss of power and on the broadest possible frequency (or a desired frequency range). In addition, some of these applications may require for a SIW to enable a single-ended transition between a PCB transmission line and a waveguide.

Example embodiments presented herein relate to SIW transition configurations that can provide a single-ended PCB-to-waveguide transition enabling energy to couple between one or more transmission lines on a PCB and a waveguide. In some examples, different configurations for low cost SIW transitions that enable single-ended PCB-to-waveguide transitions are described that can be implemented within a system rather than a lossy and bandwidth limited balun. These SIW transition configurations may be produced using simplified PCB etching techniques and implemented within systems to enable efficient propagation of electromagnetic energy between different transmission mediums. For example, communication systems, antennas, radar systems (e.g. vehicle radar systems), and other types of computing devices may be implemented using one or more example SIW transitions. Additional example embodiments are also presented that describe methods for using one or more example SIW transitions to facilitate electromagnetic energy propagation within an antenna structure and other types of system (e.g., vehicle radar systems) that include one or more transitions between a waveguide and another type of transmission medium.

By way of an example, a SIW transition may include a dielectric substrate having a top surface and a bottom surface. For instance, the SIW transition can be generated using a PCB with 2 copper layers sandwiched between a PCB laminate. The top surface of the dielectric substrate can have a metallic layer portion exposed and PCB laminate on the other remaining portion. For instance, an etching technique can remove portions of the PCB laminate to expose portions of the copper layer as desired for the configuration of the SIW transition. The metallic layer portion on the top surface can include a single-ended termination, an impedance transformer, and a metallic rectangular patch located within an open portion collectively forming a non-conductive loop. The bottom surface of the dielectric substrate similarly includes metal (e.g., a copper layer), which is electrically coupled to the metallic layer on the top surface of the dielectric substrate via a set of metallic via-holes.

The non-conductive loop and rectangular metal patch may be offset relative to a centerline that extends through both the middle of the single-ended termination and the impedance transformer. For instance, the non-conductive loop and rectangular metal patch may be shifted to the right (i.e., a right-hand offset) relative to the defined centerline. In some applications, however, a left-hand offset may be more favorable for desired results. In the case of left-hand offset, a 180° phase offset is introduced relative to the right-hand offset. Thus, the side of the offset and the degree of offset can influence the parameters of the SIW transition and may depend on the particular application within a system. In some examples, the non-conductive loop and rectangular metal patch may not be offset and align with the centerline extending through the longitudinal centers of the single-ended termination and the impedance transformer.

In other embodiments, a SIW transition may lack the rectangular patch and only include a non-conductive opening in the metallic layer. The non-conductive opening can be rectangular and similar in size as the combination of the non-conductive loop and rectangular patch. Particularly, removing the rectangular patch can decrease the complexity associated with the manufacturing process for the SIW transition. As such, the position, size, shape, and location of the non-conductive opening can vary within embodiments and may depend on the structure of the waveguide and desired properties for the SIW transition.

As indicated above, the SIW includes metallic via-holes, which form the boundaries of the waveguide by forming walls within the dielectric and couple together the upper and lower metallic layers. As such, the arrangement (e.g., spacing, position, quantity) of metallic via-holes can influence transition properties (e.g., cutoff frequencies, insertion losses) of the SIW transition and can vary within example embodiments. In some embodiments, the SIW transition includes a pair of parallel lines of metallic via-holes that extend in parallel relative to a length of the metallic rectangular patch (or non-conductive opening) such that the metallic rectangular patch is located between the pair of parallel lines of metallic via-holes. The SIW transition may also include a baseline of metallic via-holes extending between ends of the pair of linear lines of metallic holes and in parallel relative to a width of the rectangular patch (or non-conductive opening).

Metallic via-holes can be aligned in a linear array within the lines described above. In some examples, one or more of the metallic via-holes within one or more of these lines can be offset from the center of the line, which results in staggered lines of metallic via-holes. For example, another SIW transition may include metallic-via holes in a similar rectangular configuration around the coupling point of the SIW transition, but have staggered metallic via-holes rather than aligned metallic via-holes. In some instances, the staggered metallic via-holes can decrease complexity of manufacturing the SIW.

In some examples, a SIW transition may include additional lines of metallic via-holes positioned at other locations. For instance, a SIW transition can include another pair of parallel lines of plated metallic-via holes extending in parallel on opposite sides of the single-ended termination and impedance transformer. The first pair of parallel lines may provide additional isolations in applications that involve adjacent SIW transitions or/and RF sensitive components positioned close-by. The second pair of parallel lines of metallic-via holes may extend in the same direction relative to the other parallel lines positioned around the non-conductive loop (or non-conductive opening). As such, the arrangement and position of the metallic via-holes can impact the cutoff frequencies of the SIW. In addition, the spacing of the metallic via-holes can influence the insertion losses of the transitions.

Some example SIW transitions include an impedance transformer positioned between a single-ended termination and the non-conductive loop (or non-conductive opening). The configuration of the impedance transformer can taper the impedance of the SIW transition down or up to any desired single-ended impedance. Further, the combination of the offset of the non-conductive loop (or non-conductive opening) and the impedance transformer can impact the performance of the SIW transition as signals propagate between a PCB via the single-ended termination and a waveguide.

Various systems, including different types of antennas, can be implemented using one or more SIW transitions. Some examples include radar systems, communication systems, and other sensors that may require high-speed links between PCBAs using waveguides.

The following detailed description may be used with an apparatus (e.g., radar unit) having one or multiple antenna arrays. The one or multiple antenna arrays may take the form of a MIMO radar antenna architecture. One or more antenna arrays can include uniform linear array (ULA) arrangements and/or staggered arrangements. In a staggered arrangement, one or more radiating elements (antennas) can be offset relative to the alignment of other radiating elements in the array.

In some embodiments, example radar unit architecture may include a plurality of "dual open-ended waveguide" (DOEWG) antennas. The term "DOEWG" may refer to a short section of a horizontal waveguide channel plus a vertical channel that splits into two parts. Each of the two parts of the vertical channel may include an output port configured to radiate at least a portion of electromagnetic waves that enters the radar unit. Additionally, in some instances, multiple DOEWG antennas may be arranged into one or more antenna arrays.

Some example radar systems may be configured to operate at an electromagnetic wave frequency in the W-Band (e.g., 77 Gigahertz (GHz)). The W-Band may correspond to electromagnetic waves on the order of millimeters (e.g., 1 mm, 4 mm). A radar system may use one or more antennas that can focus radiated energy into tight beams to measure an environment with high accuracy. Such antennas may be compact (typically with rectangular form factors), efficient (i.e., with little of the 77 GHz energy lost to heat in the antenna or reflected back into the transmitter electronics), low cost and easy to manufacture (i.e., radar systems with these antennas can be made in high volume).

Some example radar architecture may include multiple metal layers (e.g., aluminum plates) machined with computer numerical control (CNC), aligned and joined together. For example, a metal layer may include a first half of an input waveguide channel, where the first half of the first waveguide channel includes an input port that may be configured to receive electromagnetic waves (e.g., W-band waves) into the first waveguide channel. The metal layer may also include a first half of a plurality of wave-dividing channels. The plurality of wave-dividing channels may comprise a network of channels that branch out from the input waveguide channel and that may be configured to receive electromagnetic waves from the input waveguide channel, divide the electromagnetic waves into a plurality of portions of electromagnetic waves (i.e., power dividers), and propagate respective portions of electromagnetic waves to respective wave-radiating channels of a plurality of wave-radiating channels. The waveguide antenna elements and/or the waveguide output ports may be rectangular in shape, in some embodiments. In alternative embodiments, the waveguide antenna elements and/or the waveguide output ports may be circular in shape. Other shapes are also possible.

Based on the shape and the materials of the waveguides, the distribution of propagating energy can vary at different locations within a radar unit, for example. The shape and the materials of the waveguides can define the boundary conditions for the electromagnetic energy. Boundary conditions are known conditions for the electromagnetic energy at the edges of the waveguides. For example, in a metallic waveguide, assuming the waveguide walls are nearly perfectly conducting (i.e., the waveguide walls can be approximated as perfect electric conductors—PECs), the boundary conditions specify that there is no tangentially (i.e., in the plane of the waveguide wall) directed electric field at any of the wall sides. Once the boundary conditions are known, Maxwell's Equations can be used to determine how electromagnetic energy propagates through the waveguides.

Maxwell's Equations may define several modes of operation for any given polarization-modification channel or waveguide. Each mode has one specific way in which electromagnetic energy can propagate through the waveguide. In addition, each mode has an associated cutoff frequency. A mode is not supported in a waveguide if the electromagnetic energy has a frequency that is below the cutoff frequency. By properly selecting both (i) dimensions and (ii) frequency of operation, electromagnetic energy may propagate through the polarization-modification channels and waveguides in specific modes. The waveguides can be designed so only one propagation mode is supported at the design frequency.

There are four main types of waveguide propagation modes: Transverse Electric (TE) modes, Transverse Magnetic (TM) modes, Transverse Electromagnetic (TEM) modes, and Hybrid modes. In TE modes, the electromagnetic energy has no electric field in the direction of the electromagnetic energy propagation. In TM modes, the electromagnetic energy has no magnetic field in the direction of the electromagnetic energy propagation. In TEM modes, the electromagnetic energy has no electric or magnetic field in the direction of the electromagnetic energy propagation. In Hybrid modes, the electromagnetic energy has some of both electric field and magnetic field the direction of the electromagnetic energy propagation.

TE, TM, and TEM modes can be further specified using two suffix numbers that correspond to two directions orthogonal to the direction of propagation, such as a width direction and a height direction. A non-zero suffix number indicates the respective number of half-wavelengths of the electromagnetic energy equal to the width and height of the respective polarization-modification channel or waveguide (e.g., assuming a rectangular waveguide). However, a suffix number of zero indicates that there is no variation of the field with respect to that direction. For example, a $TE_{10}$ mode indicates the polarization-modification channel or waveguide is half-wavelength in width and there is no field variation in the height direction. Typically, when the suffix number is equal to zero, the dimension of the waveguide in the respective direction is less than one-half of a wavelength. In another example, a $TE_{21}$ mode indicates the waveguide is one wavelength in width (i.e., two half wavelengths) and one half wavelength in height.

When operating a waveguide in a TE mode, the suffix numbers also indicate the number of field-maximums along the respective direction of the waveguide. For example, a $TE_{10}$ mode indicates that the waveguide has one electric field maximum in the width direction and zero maxima in the height direction. In another example, a $TE_{21}$ mode indicates that the waveguide has two electric field maxima in the width direction and one maximum in the height direction.

Referring now to the figures, FIG. 1 illustrates a SIW, according to one or more example embodiments. SIW 100 is shown as a PCB structure with two parallel copper planes 104, 106 that collectively form the top and bottom of waveguide 102 of SIW 100. The walls of SIW 100 are formed by via-holes 108 (plated through-holes) that are drilled through parallel copper planes 104, 106 as shown in FIG. 1.

SIW 100 can be manufactured using PCB etching and drilling processes and is shown positioned relative to Cartesian (XYZ) coordinate system. In some implementations, via-holes 108 are back drilled to remove any remaining stubs from the substrate. SIW 100 is configured such that waveguide 102 is filled with dielectric with the metal boundaries formed by via-holes 108 providing confinement of electromagnetic waves that propagate in SIW 100. The level of confinement may depend on via diameter 110 and via spacing 112 (i.e., vertical space extending between the centers of consecutive via-holes 108) as shown in FIG. 1. Because the design of SIW 100 is somewhat open, the geometry of the structure can be designed in a way that provides confinement and also prevents conducted and radiated emissions in other areas of a system. In general, the via walls formed by via-holes 108 can act like a typical via-fence in an radio frequency (RF) PCB layout that confines electromagnetic radiation within the parallel arrangement of via-holes 108.

Similar to a rectangular or cylindrical waveguide, SIW 100 may have an infinite set of modes that correspond to the eigenfunctions for the structure, specifically defined by distances 114, 116 between the two arrays of via-holes 108, which can be indexed using two integers (n and m). When SIW 100 is used within an application for a specific frequency, the propagation constant along the z direction can be defined in terms of the source frequency and the two integers (n and m). The spatiotemporal distribution of the electromagnetic field TE modes (equation 1) and the dispersion relation defining the (n and m) wavenumber (equation 2) can be represented as follows:

$$\varphi(x,y,z,t) = A_{nm} e^{k_{nm}z - i\omega t} \sin\sin\left(\frac{n\pi x}{W}\right)\sin\sin\left(\frac{m\pi y}{H}\right) \quad (1)$$

$$k_{nm} = \sqrt{\left(\frac{\omega}{c}\right)^2 - \left(\frac{n\pi}{W}\right)^2 - \left(\frac{m\pi}{H}\right)^2} \quad (2)$$

where φ (x, y, z, t) represents spatiotemporal distribution of the electromagnetic field TE modes relative to Cartesian coordinates (x, y, z) across time, $k_{nm}$ represents the dispersion relation for wave number nm, A represents amplitude of the wave, W represents width of the waveguide, H represents the height of the waveguide, t represents time at which the wave is described, c represents the speed of light, ω represents angular frequency, and z is the direction of propagation of the wave.

Equations 1 and 2 together collectively represent the electric and magnetic field function in a substrate integrated waveguide. The total electromagnetic field can be determined by calculating the sum of fields from each mode. The sine functions can satisfy closed boundary conditions in waveguide 102 at the edges.

A system can excite a specific set of modes in SIW 100 via a selection of a particular frequency. As such, the wavenumber in the above equations can be complex for certain modes when the frequency is below the value for the n and m terms. As a result, these modes may decay. For instance, modes (1,1) and (1,0) can be excited depending on the geometry, if the frequency is high enough, while all higher order modes with (n>1, m>1) can decay to zero. As a result, the electromagnetic field structure can be designed as desired when implementing SIW 100. For example, the cutoff for the TE10 mode can be represented as follows:

$$k_{10} = \sqrt{\left(\frac{\omega}{c}\right)^2 - \left(\frac{\pi}{W}\right)^2}, \text{ where } \alpha = W + \left(\frac{d^2}{0.95s}\right) \quad (3)$$

where α represents the cutt-off frequency of the waveguide, s represents the via spacing and d represents the via diameter.

If the source wavenumber is less than the cutoff frequency for the TE10 mode as expressed in equation 3, then all modes may decay. As shown, SIW 100 can provide significant isolation against lower frequency signals in the PCB, which enables SIW 100 to be implemented alongside other circuits that may operate at lower frequencies. SIW 100 can provide efficient confinement when via spacing 112 is less than double via diameter 110 and when the signal wavelength in waveguide 102 (calculated using the signal frequency and the effective refractive index) is greater than 5 times via diameter 110. Similar conditions can be derived when multiple modes are excited with a single frequency, which enable engineering the field distribution required for various different passive RF systems.

SIW 100 can be used within a system with other passive RF components, such as directional or multi-port couplers. For instance, SIW 100 can split a coherent wave into waves propagating in multiple directions with minimal losses. In some examples, SIW 100 and other SIW structures presented herein can operate as part of a slotted antenna, which can enable engineering the electromagnetic field distribution in a way that enables directionality operations. SIW 100 can also be used with one or more amplifiers.

All these applications may rely on constructive interference involving one or more electromagnetic waves in a well-defined structure. As such, a substrate integrated waveguide design and other structures are extremely useful in the V band/M band and higher, where active RF components are still lacking in terms of performance. An advantage for use in millimeter wave circuits is the reduced losses in the V band/M band. Similarly, SIW 100 can have significant isolation, which allows SIW 100 to be easily used alongside other circuits on PCB materials. The mode structure can be further engineered by simply choosing the appropriate laminate with the desired dielectric constant.

Figure 2B:
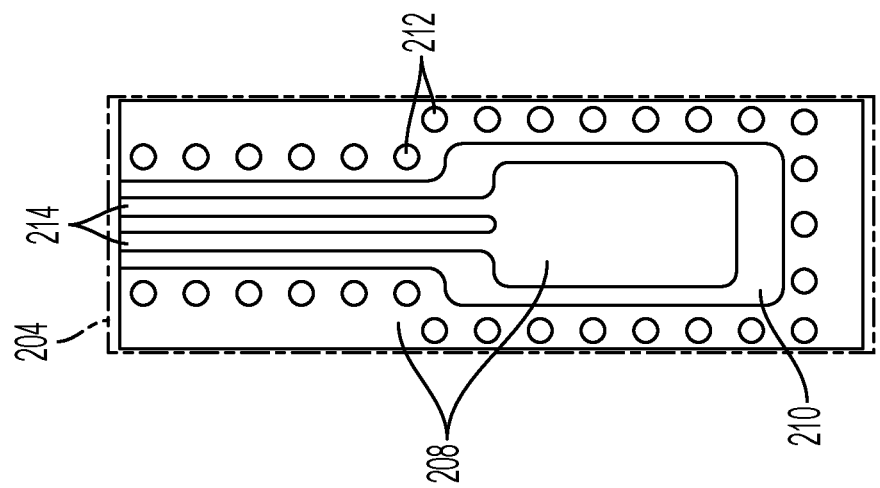
FIG. 2B illustrates the twin-line fed Patch transition from the PCBA shown in FIG. 2A, according to one or more example embodiments.
Figure 2A:
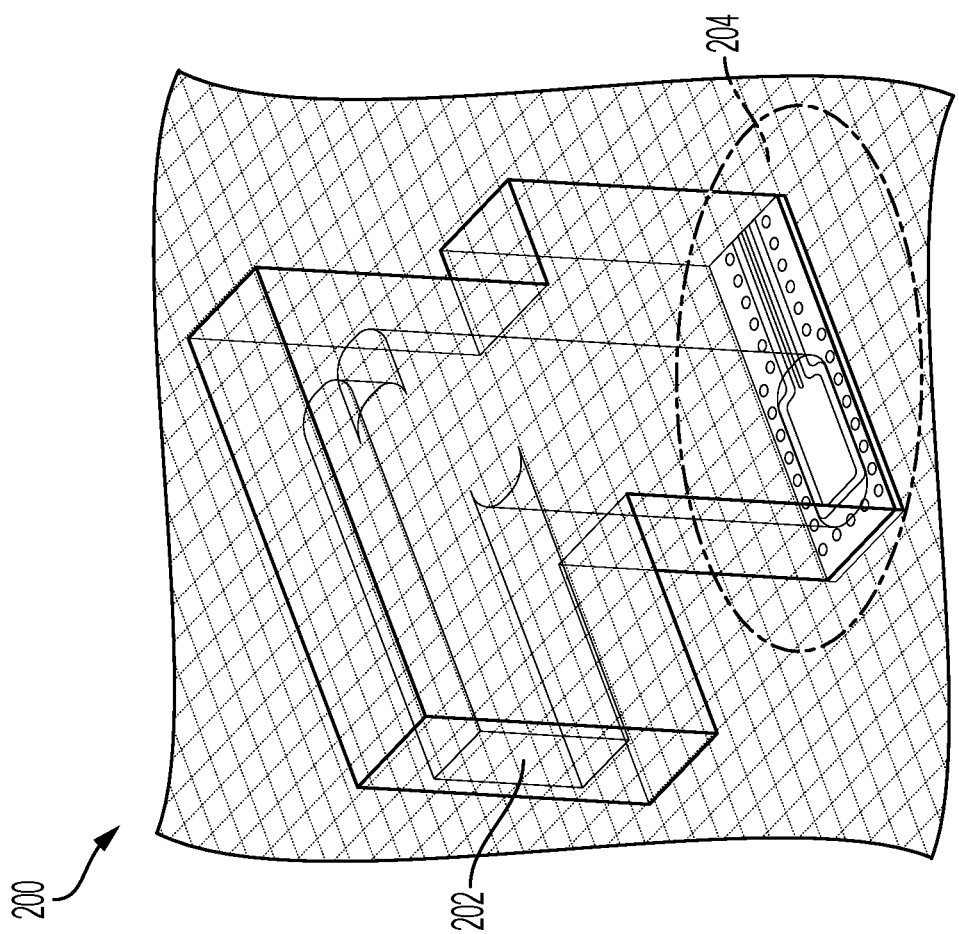
FIG. 2A illustrates a printed circuit board to waveguide assembly (PCBA), according to one or more example embodiments.

FIG. 2A illustrates printed circuit board assembly (PCBA). In the embodiment, PCBA 200 represents an example transition between different transmission media that includes waveguide 202 and Patch transition 204. The configuration of PCBA 200 may differ in other embodiments.

In some examples, PCBA 200 may be part of a radar unit (or another antenna structure) configured to transmit signals into the environment and/or receive signals from the environment using one or more antennas. The configuration of the radar unit can vary within embodiments and may include one or more antenna arrays implemented in a layout based on a desired performance. The radar unit may operate as part of a vehicle radar system.

As shown in FIG. 2A, PCBA 200 can enable an electrical connection between waveguide 202 and a corresponding PCB via Patch transition 204, which allows electromagnetic energy to propagate from the PCB to waveguide 202 and vice versa via Patch transition 204. For example, a PCB may provide signals for subsequent transmission via one or more radiating elements electrically coupled to waveguide 202 by inputting the signals into waveguide 202 via Patch transition 204.

To further illustrate, FIG. 2B depicts an elevated view of Patch transition 204 from PCBA 200 without waveguide 202. In particular, FIG. 2B shows Patch transition 204 from an elevated perspective. In the example embodiment, Patch transition 204 is implemented with twin-line termination 214 and consists of metal surfaces 208, PCB laminate 210, and via-holes 212. Twin-line termination 214 may require a similarly configured transmission line (e.g., microstrips) with two connections that can each couple to one of the ends of twin-line termination 214 of Patch transition 204. As a result, Patch transition 204 may limit the uses of PCBA 200 in some instances due to the dual configuration of twin-line termination 214. In particular, implementing Patch transition 204 within a system may involve additional circuitry and/or other components when a system involves coupling a waveguide to a single-ended transmission line. This can result in increasing the complexity of the system and reduce the effectiveness of the transmission medium transitions.

Figure 3:
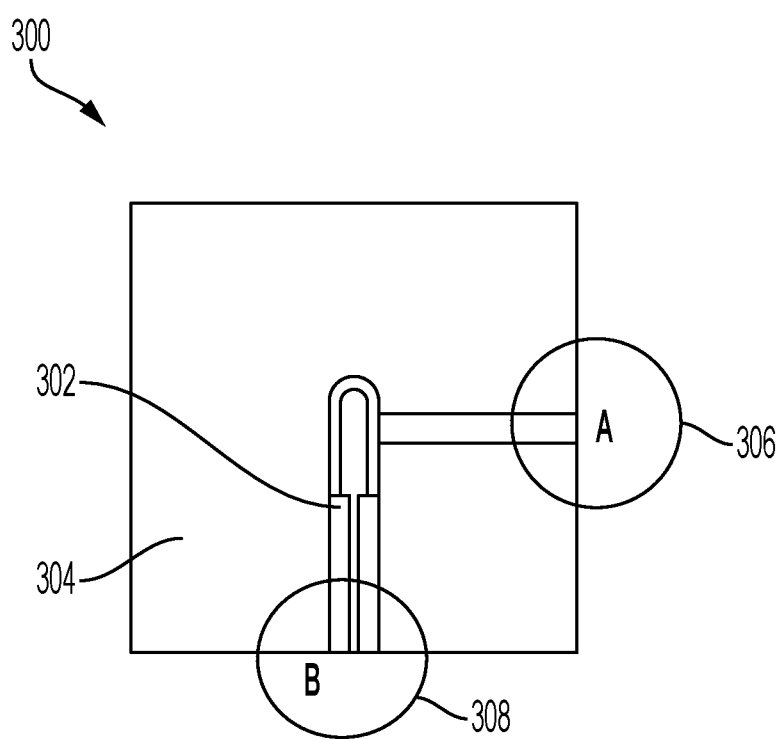
FIG. 3 illustrates a balun, according to one or more example embodiments.

FIG. 3 illustrates a balun, according to one or more example embodiments. In order to use Patch transition 204 in Figures 2A and 2B to electrically couple a single-ended transmission line to a waveguide, balun 300 can be used as the interconnection. In particular, balun 300 can enable a single-ended transmission line to couple twin-line termination 214 of Patch transition 204 in Figures 2A and 2B.

As shown in FIG. 3, balun 300 includes two ends, single-end transition 306 with coupling end "B" and twin-end transition 308 with coupling end "A", which are positioned on PCB 304. Balun 300 can operate by transforming a single-ended transmission to a twin-ended transmission and vice versa. For example, twin-end transition 308 includes transmission line pair 302 and can be coupled to twin-line termination 214 of Patch transition 204 at portion A to enable an electrical connection between a single-ended transmission line and Patch transition 204. In this example, the single-ended transmission line couples to balun 300 at single-ended transition 306. As such, balun 300 can be used to connect lines of differing impedance and may use magnetic coupling in some implementations.

In some cases, the use of balun 300 can cause issues when implemented within a system. Balun 300 may be bandwidth limited, which can limit the overall bandwidth available for operations of the system. This bandwidth limitation may be less than desirable in some applications, such as within a vehicle radar system or another type of system (e.g., communication). In addition, balun 300 can also increase the insertion loss that occurs within the transition between transmission mediums. In turn, performance of a system can suffer. Furthermore, the etching of the balun details requires additional careful handling, which can potentially negatively impact production yields.

Figure 4:
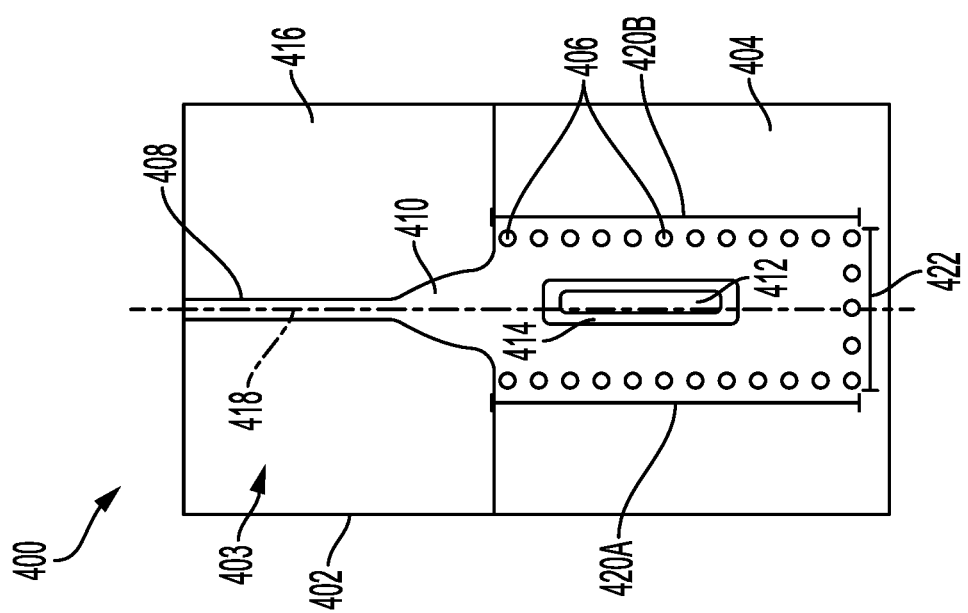
FIG. 4 illustrates a SIW transition configuration, according to one or more example embodiments.

To overcome these potential issues, FIG. 4 illustrates a configuration for SIW transition that can be used to couple a single-ended transmission line and a waveguide without requiring the use of balun 300 as shown in FIG. 3. In the embodiment shown in FIG. 4, SIW transition 400 includes dielectric substrate 402, metallic layer portion 404, and metallic via-holes 406, which collectively enable SIW transition 400 to efficiently propagate electromagnetic energy between single-ended transmission line and a waveguide. SIW transition 400 can be used to enable bidirectional transfer of electromagnetic energy between a waveguide and a PCB within various systems, such as antenna, radar, and communication systems. In other examples, SIW transition 400 can have another configuration with more or less components.

SIW transition 400 includes dielectric substrate 402, which serves as the base for positioning other components of SIW transition 400. In the example embodiment, dielectric substrate 402 corresponds to a PCB with top surface 403 shown from a top view perspective in FIG. 4. As shown, top surface 403 of dielectric substrate 402 includes PCB laminate 416 on some portions and metallic layer portion 404 on other portions. Manufacturing SIW transition 400 may involve etching into portions of PCB laminate 416 to form metallic layer portion 404 and drilling via-holes 406 per the desired arrangement as depicted in FIG. 4. As such, different techniques can be used during the manufacturing process.

Metallic layer portion 404 of SIW transition 400 represents a conductive layer coupled to top surface 403 of dielectric substrate 402 and includes components that enable propagation of electromagnetic energy between different transmission mediums (e.g., a single-ended transmission line and a waveguide in a manner similar PCBA 200 illustrated in FIG. 2A). Metallic layer portion 404 can be made out of copper, aluminum, or other types of metals.

Metallic layer portion 404 may be etched during manufacturing of SIW transition 400. Etching can be used in microfabrication to chemically remove layers from the surface of a wafer (e.g., top surface 403 of dielectric substrate 402). In the embodiment shown in FIG. 4, metallic layer portion 404 includes single-ended termination 408, impedance transformer 410, and metallic rectangular patch 412. These components may be created during the etching process. As such, metallic layer portion 404 may be configured to couple to a waveguide such that electromagnetic energy is able to propagate between metallic rectangular patch 412 and the waveguide. In other examples, other manufacturing techniques can be used to generate SIW transition 400.

Single-ended termination 408 represents a portion of metallic layer portion 404 that can electrically couple to a single-ended transmission line, such as a microstrip or another component on the PCB. In such a configuration, single-ended termination 408 may couple signals from the PCB into a waveguide via a combination of metallic rectangular patch 412 and non-conductive loop 414. In particular, a PCB may supply signals that propagate a single-ended transmission along single-ended termination 408, impedance transformer 410, and into the waveguide via metallic rectangular patch 412 and non-conductive loop 414 while metallic via-holes 406 form boundaries that can limit the propagation of the signals in SIW transition 400. In addition, single-ended termination 408 can similarly be configured to couple signals from the waveguide to the PCB. In particular, electromagnetic energy propagates from the waveguide into the SIW transition 400 via metallic rectangular patch 412 and non-conductive loop 414 and subsequently from single-ended termination 408 to the single-ended transmission line coupled to the PCB.

The length and width of single-ended termination 408 can vary in embodiments. For instance, single-ended termination 408 can be wider and/or longer in other embodiments. In addition, single-ended termination 408 is shown extending along the length of top surface 403 of dielectric substrate 402 and in the center of the width of dielectric substrate 402. In other embodiments, single-ended termination 408 can have another position and orientation (e.g., diagonal) relative to dielectric substrate 402.

Impedance transformer 410 can be used to adjust impedance for SIW transition 400. For instance, impedance transformer 410 can be used to match the impedance between electromagnetic energy coupling between the PCB and the waveguide. In the embodiment shown, impedance transformer 410 includes a tapered transition configuration, which can be configured to taper the impedance of SIW transition 400 up or down to any desired single-ended impedance. For example, impedance transformer 410 can be used to couple a 50-Ohm microstrip to SIW transition 400. In other embodiments, impedance transformer 410 may have different configuration that depends on tapering the impedance between a single-ended transmission line and a waveguide.

As further shown, metallic rectangular patch 412 is located within an open portion in metallic layer portion 404 such that the open portion forms a non-conductive loop (i.e., non-conductive loop 414) around metallic rectangular patch 412. In the embodiment shown in FIG. 4, the open portion is positioned relative to impedance transformer 410 and aligned offset relative to centerline 418 that extends through a center of single-ended termination 408 and a center of impedance transformer 410. In particular, non-conductive loop 414 is shown having a positional offset to the right-hand side with respect to SIW transition 400. The combination of metallic rectangular patch 412 and non-conductive loop 414 can enable the power transfer between dielectric substrate 402 and a waveguide (not shown in FIG. 4), which may be based on the amount that non-conductive loop 414 is offset relative to centerline 418.

Metallic rectangular patch 412 can have another configuration in other example embodiments. In particular, the size, shape, and position of metallic rectangular patch 412 can differ. For instance, SIW transition 400 may include a metallic square patch rather than metallic rectangular patch 412. In another embodiment, SIW transition 400 may include multiple patches separated from other portions of metallic layer portion 404 via non-conductive portions. In some embodiments, SIW transition 400 may include a non-conductive opening that lacks any metallic patch.

In the embodiment shown in FIG. 4, metallic layer portion 404 is coupled to a first half of top surface 403 of dielectric substrate 402 such that only impedance transformer 410 and single-ended termination 408 are coupled to a second half of top surface 403 of dielectric substrate 402. In other embodiments, the arrangement of metallic layer portion 404 relative to top surface 403 can differ. For instance, when SIW 400 includes a longer single-ended termination, the ratio of metallic layer portion 404 and PCB laminate 416 can differ.

SIW transition 400 also includes a second metallic layer portion coupled to the bottom surface of dielectric substrate 402. For instance, dielectric substrate 402 can have 2 metal layers (e.g., a top copper layer and a bottom copper layer) sandwiched between PCB laminate, such as PCB laminate 416 shown in FIG. 4. As indicated above, etching or another process can be used to remove portions of PCB laminate 416 to create components in metallic layer portion 404. For example, a machining process can be used to etch single-ended termination 408, impedance transformer 410, and metallic rectangular patch 412 out from PCB laminate 416. The etching process can be used to leave a portion of PCB laminate 416 in an inner middle position of metallic layer portion 404 to form non-conductive loop 414 around metallic rectangular patch 412.

Metallic via-holes 406 can be used to electrically couple metallic layer portion 404 to a second metallic layer portion coupled to the bottom surface of dielectric substrate 402 (not shown). As such, the quantity, size, and arrangement of metallic via-holes 406 can differ within examples. In the example embodiment, metallic via-holes 406 includes pair of parallel lines of metallic via-holes 406 (e.g., line 420A and line 420B) extending in parallel relative to a length of metallic rectangular patch 412 such that the metallic rectangular patch 412 is located between the pair of parallel lines of metallic via-holes. In this configuration, metallic rectangular patch 412 is positioned between line 420A and line 420B. Line 420A, 420B, formed by the arrangement of some metallic via-holes 406, represent fences that limit the propagation area of electromagnetic energy for SIW 400.

In addition, baseline 422 is another boundary formed of metallic via-holes 406 and extends between ends of the parallel pair of lines of metallic holes (i.e., lines 420A, 420B) and in parallel relative to a width of rectangular patch 412. In example embodiment, parallel lines of metallic via-holes (i.e., lines 420A and 420B) are equal in length. This length of the parallel lines of metallic via-holes is greater than a given length of baseline 422 of metallic via-holes. As such, the structure formed by the arrangement of metallic via-holes 406 can determine the cutoff frequencies of SIW transition 400. The arrangement of metallic via-holes 406 can differ in other examples. For instance, the rectangular propagation volume formed by lines 420A, 420B and baseline 422 can be larger or smaller overall. In other embodiments, lines 420A, 420B and/or baseline 422 may be positioned closer to metallic rectangular patch 412.

Figure 5:
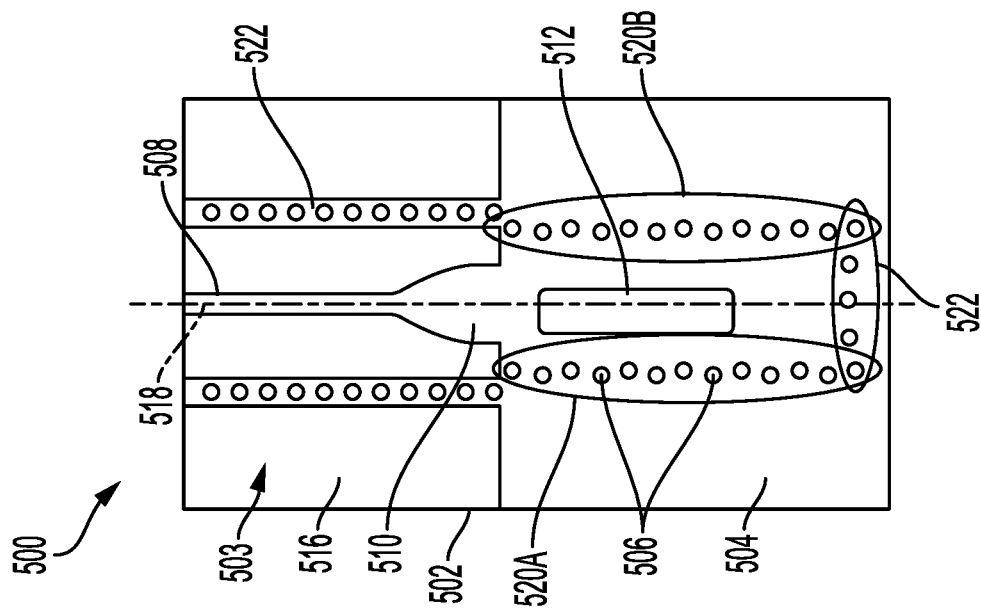
FIG. 5 illustrates another SIW transition configuration, according to one or more example embodiments.

FIG. 5 illustrates another configuration for a SIW transition, according to one or more example embodiments. As shown, SIW transition 500 is structurally similar to SIW transition 400 as shown in FIG. 4 in some aspects and different in others. In the example embodiment, SIW transition 500 similarly includes dielectric substrate 502, metallic layer portion 504, and metallic via-holes 506 that collectively enable SIW transition 500 to efficiently propagate electromagnetic energy between a single-ended transmission line and a waveguide. In other examples, SIW transition 500 can have another configuration with more or less components.

Metallic layer portion 504 of SIW transition 500 similarly include single-ended termination 508 and impedance transformer 510 coupled to top surface 503 of dielectric substrate 502. Metallic layer portion 504 is positioned on an opposite side from PCB laminate 516 as shown in FIG. 5. Unlike SIW transition 400 shown in FIG. 4, however, SIW transition 500 is depicted with non-conductive opening 512, which does not include a metallic patch. The lack of a metallic patch can reduce the complexity of manufacturing SIW transition 500. In other embodiments, SIW 500 can be configured with a metallic patch in non-conductive opening 512 similar to SIW transition 400.

As further shown in FIG. 5, non-conductive opening 512 is positioned at an offset (i.e., left hand offset) relative to centerline 518, which extends through the center of single-ended termination 508 and the center of impedance transformer 510. The degree of offset can differ within examples and may be based on the desired properties for SIW transition 500. The left hand offset of non-conductive opening 512 on SIW 500 differs from the right hand offset of non-conductive loop 414 and metallic rectangular patch 412 on SIW 400 as shown in FIG. 4. As such, the left-hand offset results in a 180° phase offset relative to the right-hand offset.

Another difference between SIW 500 and SIW 400 involves the arrangement of metallic via-holes 506. Similar to SIW 400, SIW 500 includes metallic via-holes 506 defining boundaries of the waveguide relative to impedance transformer 510 and non-conductive opening 512. Some metallic via-holes 506 form parallel lines 520A, 520B that extend in parallel to each other and relative to a length of non-conductive opening 512. In addition, some metallic via-holes 506 form baseline 522. In the example embodiment shown in FIG. 5, lines 520A, 520B and baseline 522 have staggered alignment, which involves some of the metallic via-holes within each line being offset relative to a centerline of the line. The staggered alignment may provide a more robust design towards the misalignment of the via-holes during manufacturing.

In the example embodiment, SIW transition 500 additionally includes two via-hole fences 520A, 520B formed by metallic via-holes 506 plated and etched within PCB laminate 516. Via-hole fences 520A, 520B extend parallel relative to each other and are positioned on opposite sides of single-ended termination 508 and impedance transformer 510. In such a configuration, via-hole fences 520A, 520B may be included as part of SIW 500 to provide an additional channel isolation relative to single-ended termination 508. In other embodiments, SIW transition 500 may not include via-hole fences 520A, 520B.

Figure 6:
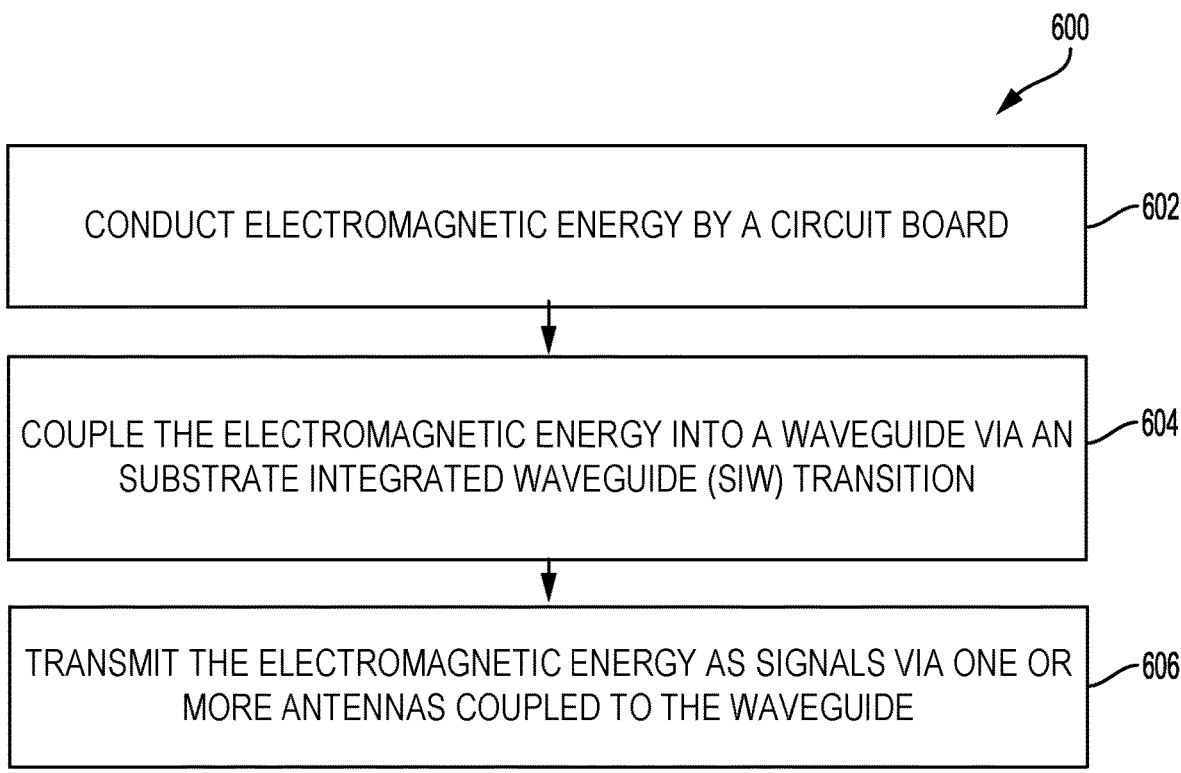
FIG. 6 is a flowchart of a method to couple electromagnetic energy into a waveguide via a SIW transition, according to one or more example embodiments.

FIG. 6 is a flowchart of a method to couple electromagnetic energy into a waveguide, according to one or more example embodiments. Method 600 may include one or more operations, functions, or actions, as depicted by one or more of blocks 602, 604, and 606, each of which may be carried out by any of the systems shown in prior figures, among other possible systems.

Those skilled in the art will understand that the flow charts described herein illustrate functionality and operation of certain implementations of the present disclosure. In this regard, each block of the flowchart may represent a module, a segment, or a portion of program code, which includes one or more instructions executable by one or more processors for implementing specific logical functions or steps in the process. The program code may be stored on any type of computer readable medium, for example, such as a storage device including a disk or hard drive.

In addition, each block may represent circuitry that is wired to perform the specific logical functions in the process. Alternative implementations are included within the scope of the example implementations of the present application in which functions may be executed out of order from that shown or discussed, including substantially concurrent or in reverse order, depending on the functionality involved, as would be understood by those reasonably skilled in the art.

At block 602, method 600 involves conducting electromagnetic energy via a transmission line on a PCB. The PCB can be part of a system, such as a vehicle radar system. For instance, each radar unit may include a PCBA that couples one or more waveguides to a PCB that is configured to generate signals for transmission and/or receives signals for processing. The transmission line may be a single-ended transmission line.

At block 604, method 600 involves coupling the electromagnetic energy into a waveguide via an SIW transition. The SIW transition may be implemented similar to SIW transition 400 shown in FIG. 4 or SIW transition 500 shown in FIG. 5. These SIW transitions can enable coupling the single-ended transmission line of the PCB directly to the waveguide without reliance on a balun and a Patch transition.

As an example, the SIW transition may include a dielectric substrate having a top surface and a bottom surface and a first metallic layer portion coupled to the top surface of the dielectric substrate. The first metallic layer portion may include a single-ended termination, an impedance transformer, and a metallic rectangular patch located within an open portion in the first metallic layer portion such that the open portion forms a non-conductive loop around the metallic rectangular patch. The SIW transition may also include a second metallic layer portion coupled to the bottom surface of the dielectric substrate and a set of metallic via-holes electrically coupling the first metallic layer portion to the second metallic layer portion. The single-ended termination can enable coupling the transmission line of the PCB to a waveguide with minimal losses.

At block 606, method 600 involves transmitting the electromagnetic energy as signals via one or more antennas coupled to the waveguide. For example, a radar unit may transmit the electromagnetic energy as radar signals using one or more antenna arrays. The waveguide can receive electromagnetic energy from the PCB through the SIW transition through the coupling between the single-ended transmission line of the PCB and the single-ended termination of the SIW transition.

In some embodiments, method 600 may also involve receiving one or more signals from the one or more antennas coupled to the waveguide and coupling electromagnetic energy corresponding to the one or more signals from the waveguide and to the PCB via the SIW transition. The antennas can receive signals from the environment and propagate the signals through the waveguide to the PCB via the SIW transition.

The above detailed description describes various features and functions of the disclosed systems, devices, and methods with reference to the accompanying figures. While various aspects and embodiments have been disclosed herein, other aspects and embodiments will be apparent. The various aspects and embodiments disclosed herein are for purposes of illustration and are not intended to be limiting, with the true scope being indicated by the following claims.

It should be understood that arrangements described herein are for purposes of example only. As such, those skilled in the art will appreciate that other arrangements and other elements (e.g. machines, apparatuses, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

What is claimed is:

1. An apparatus comprising:
   a dielectric substrate having a top surface and a bottom surface;
   a first metallic layer portion coupled to the top surface of the dielectric substrate, wherein the first metallic layer portion comprises:
      a single-ended termination, and
      an impedance transformer positioned between the single-ended termination and an open portion in the first metallic layer portion, wherein the impedance transformer tapers from a first end positioned proximate the single-ended termination to a second end positioned proximate the open portion, and wherein the open portion has a rectangular configuration with long sides thereof aligned in parallel to a centerline that extends between the single-ended termination and the impedance transformer;
   a second metallic layer portion coupled to the bottom surface of the dielectric substrate; and
   a set of metallic via-holes electrically coupling the first metallic layer portion to the second metallic layer portion.

2. The apparatus of claim 1, wherein the top surface and the bottom surface of the dielectric substrate are printed circuit board (PCB) laminate, and wherein the first metallic layer portion is coupled to the PCB laminate.

3. The apparatus of claim 1, wherein the first metallic layer portion is coupled to a first half of the top surface of the dielectric substrate with only the impedance transformer and the single-ended termination coupled to a second half of the top surface of the dielectric substrate.

4. The apparatus of claim 1, wherein the single-ended termination is configured to couple to a transmission line on a PCB.

5. The apparatus of claim 4, wherein the single-ended termination is configured to couple a first signal from the transmission lines on the PCB into a waveguide via the open portion, wherein the waveguide is positioned proximate the open portion, and wherein the single-ended termination is configured to couple a second signal from the waveguide to the transmission lines on the PCB via the open portion.

6. The apparatus of claim 1, wherein the set of metallic via-holes comprises:

a pair of parallel lines of metallic via-holes extending in parallel relative to the long sides of the open portion such that the open portion is located between the pair of parallel lines of metallic via-holes; and
a baseline of metallic via-holes extending between ends of the pair of parallel lines of metallic via-holes and in parallel relative to short sides of the open portion.

7. The apparatus of claim 6, wherein the pair of parallel lines of metallic via-holes are equal in length, and wherein a length of each parallel line of metallic via-holes is greater than a given length of the baseline of metallic via-holes.

8. The apparatus of claim 1, wherein the first metallic layer portion is configured to couple to a waveguide such that electromagnetic energy is able to propagate through the open portion and into the waveguide.

9. The apparatus of claim 1, wherein the first metallic layer portion includes a metallic rectangular patch positioned located within the open portion in the first metallic layer portion such that the open portion forms a non-conductive loop around the metallic rectangular patch.

10. A system comprising:
    a waveguide;
    a substrate integrated waveguide (SIW) transition coupled to the waveguide, wherein the SIW transition comprises:
       a dielectric substrate having a top surface and a bottom surface;
       a first metallic layer portion coupled to the top surface of the dielectric substrate, wherein the first metallic layer portion comprises:
          a single-ended termination, and
          an impedance transformer positioned between the single-ended termination and an open portion in the first metallic layer portion, wherein the impedance transformer tapers from a first end positioned proximate the single-ended termination to a second end positioned proximate the open portion, and wherein the open portion has a rectangular configuration with long sides thereof aligned in parallel to a centerline that extends between the single-ended termination and the impedance transformer;
       a second metallic layer portion coupled to the bottom surface of the dielectric substrate; and
       a set of metallic via-holes electrically coupling the first metallic layer portion to the second metallic layer portion.

11. The system of claim 10, wherein the first metallic layer portion includes a metallic rectangular patch positioned located within the open portion in the first metallic layer portion such that the open portion forms a non-conductive loop around the metallic rectangular patch.

12. The system of claim 10, wherein the top surface and the bottom surface of the dielectric substrate are printed circuit board (PCB) laminate, and wherein the first metallic layer portion is coupled to the PCB laminate.

13. The system of claim 10, wherein the first metallic layer portion is coupled to a first half of the top surface of the dielectric substrate with only the impedance transformer and the single-ended termination coupled to a second half of the top surface of the dielectric substrate.

14. The system of claim 10, further comprising:
    a printed circuit board (PCB) having a transmission line; and
    wherein the single-ended termination is configured to couple to the transmission line on the PCB.

15. The system of claim 14, wherein the single-ended termination is configured to couple a first signal from the transmission lines on the PCB into the waveguide via the SIW transition, and wherein the single-ended termination is configured to couple a second signal from the waveguide to the transmission lines on the PCB via the SIW transition.

16. The system of claim 14, wherein the pair of parallel lines of metallic via-holes are equal in length, and wherein the length of the parallel lines of metallic via-holes is greater than a given length of the baseline of metallic via-holes.

17. The system of claim 10, wherein the set of metallic via-holes comprises:

a pair of parallel lines of metallic via-holes extending in parallel relative to the long sides of the open portion such that the open portion is located between the pair of parallel lines of metallic via-holes; and a baseline of metallic via-holes extending between ends of the pair of parallel lines of metallic via-holes and in parallel relative to short sides of the open portion.

18. A method comprising:

conducting electromagnetic energy via a transmission line on a printed circuit board (PCB);

coupling the electromagnetic energy into a waveguide via an SIW transition, wherein the SIW transition comprises:

a dielectric substrate having a top surface and a bottom surface;

a first metallic layer portion coupled to the top surface of the dielectric substrate, wherein the first metallic layer portion comprises:

a single-ended termination, and an impedance transformer positioned between the single-ended termination and an open portion in the first metallic layer portion, wherein the impedance transformer tapers from a first end positioned proximate the single-ended termination to a second end positioned proximate the open portion, and wherein the open portion has a rectangular configuration with long sides thereof aligned in parallel to a centerline that extends between the single-ended termination and the impedance transformer;

a second metallic layer portion coupled to the bottom surface of the dielectric substrate; and a set of metallic via-holes electrically coupling the first metallic layer portion to the second metallic layer portion; and transmitting the electromagnetic energy as signals via one or more antennas coupled to the waveguide.

19. The method of claim 18, further comprising:

receiving one or more signals from the one or more antennas coupled to the waveguide; and coupling electromagnetic energy corresponding to the one or more signals from the waveguide and to the transmission lines on the PCB via the SIW transition.

* * * * *